US005555209A

United States Patent [19]
Smith et al.

[11] Patent Number: 5,555,209
[45] Date of Patent: Sep. 10, 1996

[54] CIRCUIT FOR LATCHING DATA SIGNALS FROM DRAM MEMORY

[75] Inventors: Mark L. Smith, Laguna Beach; Randy W. Raasch, Mission Viejo, both of Calif.

[73] Assignee: Simple Technology, Inc., Santa Ana, Calif.

[21] Appl. No.: 510,376

[22] Filed: Aug. 2, 1995

[51] Int. Cl.$^6$ ........................................... G11C 7/00
[52] U.S. Cl. .................. 365/189.05; 365/149; 365/238.5
[58] Field of Search ............................ 365/189.05, 149, 365/230.08, 238.5; 395/425

[56] References Cited

U.S. PATENT DOCUMENTS

| | | | |
|---|---|---|---|
| 5,278,790 | 1/1994 | Kanabara | 365/189.05 |
| 5,375,089 | 12/1994 | Lo | 365/189.05 X |
| 5,386,383 | 1/1995 | Raghavachari | 365/189.05 |
| 5,490,114 | 2/1996 | Butler et al. | 365/189.05 |

OTHER PUBLICATIONS

Technical Note, TN–04–29, Maximizing EDO Advantages, Micron Technology, Inc. 1986, pp. 3–12.

*Primary Examiner*—David C. Nelms
*Assistant Examiner*—Huan Hoang
*Attorney, Agent, or Firm*—Knobbe, Martens, Olson & Bear

[57] ABSTRACT

A circuit for latching data signals emanating from a DRAM memory for an extended period of time. The circuit is implemented on an ASIC chip which is positioned external to an FPM DRAM-type memory device. The circuit is organized to have a system transceiver, a memory transceiver, a data-in bus, a data-out bus, and control logic. The data-in bus is directly connected to a memory processor or controller through the system transceiver and the data-out bus is directly connected to the memory through the memory transceiver. The data-in bus is connected to the memory through a tri-state buffer positioned in the memory transceiver and the tri-state buffer is normally in an on position thereby normally connecting the data-in bus to the memory. The data-out bus is connected to the memory processor through a tri-state buffer which is normally in an off position. Hence, the circuit is normally configured to write data. In a read cycle, the data-in bus is isolated from the memory and the data-out bus is connected to the memory processor by manipulation of the tri-state buffers. The data is then latched in the latch on the data-out bus for an extended time period, e.g., until the memory processor sends a CAS signal to the memory and the circuit initiating a subsequent read cycle.

33 Claims, 6 Drawing Sheets

FPM MODE ACCESS CYCLE

EDO ACCESS CYCLE

CIRCUIT FOR LATCHING DATA SIGNALS FROM DRAM MEMORY

BACKGROUND OF THE INVENTION

1. Field of the Invention

The present invention relates to manipulation of output signals from memory devices and, in particular, concerns a circuit for latching data signals output from a DRAM memory device so that a memory controller can better access the data signals.

2. Description of the Related Art

Memory devices are used in all types of processing circuits. DRAM and SRAM memories are two typical memory devices that are commonly used in computer applications. Generally, data is stored in these types of memories in an array of cells wherein the array of cells is addressable by row and column. Typically, when a memory processor, such as a memory controller, wishes to access data within the memory, a row address and column address signal is sent to the memory and, after a short period of time, the data contained within the appropriate cells is output on a data bus.

One difficulty with memory circuits is that the processor needs to be able to access the data in memory very quickly. For the standard DRAM circuit, the access time can be so long that the processor has to sit idle awaiting the data from the memory, thereby slowing down the system incorporating the processor. The standard DRAM access cycle is comprised of the steps of 1) placing the row address of the storage cells to be accessed on the address input pins of the memory chip, 2) placing a logic low signal on the row address select (RAS) input pin, 3) placing the column address of the storage cells to be accessed on the address input pins of the memory chip, and 4) placing a logic low on the column address select (CAS) input pin. After this cycle has been completed, which usually takes 60–80 nanoseconds, the data is output from the memory device typically after a delay of 15 to 20 nanoseconds. It will be appreciated that computer circuits have to repeatedly perform this access cycle during normal operation. Hence, performing each of these steps for each piece of data which the processor requires can result in the processor operating at a slow rate.

To address this problem in the particular applications of DRAM memories, DRAMs incorporating other access cycles have been developed. For example, one typical access cycle is known as the fast page mode (FPM) access cycle. The FPM access cycle is similar to the standard access cycle described above except the memory is organized so that a "page" corresponds to one row of addresses. Hence, in the FPM memory once the processor accesses data the first time from a page, on each subsequent cycle where the processor is accessing data from the same page, the RAS input remains low and the previously entered row address signals are maintained. For each subsequent cycle of an FPM DRAM memory, where the processor is seeking data that is contained on the same page as the previously sought data, the processor simply has to place the new column address signals on the address input pins and then place a logic low on the CAS pin to obtain the data. Hence, in the FPM DRAM device, the steps of placing the row address inputs on the address input pins and placing a low RAS signal on the RAS input pin are only required when data is being sought on a different page and can otherwise be eliminated. This results in faster access of data by the processor.

FIG. 1A is a timing diagram which illustrates a series of typical data cycles of an FPM DRAM memory wherein data stored on the same page is being accessed. As shown in FIG. 1A, the data is valid, i.e., accessible to the processor requesting the data, from a short time after the CAS period has gone low to a short time after the CAS signal goes high again. The access time for each cycle in an FPM DRAM device is defined as the time period from where the CAS signal goes high to the time at which the next valid data signals are output on the data output pins. One can appreciate, in viewing FIG. 1A, that the time period where the data is valid is substantially less than the access time for the processor to obtain data out of an FPM mode DRAM device successively reading data off of the same page in memory.

The fact that the data is valid for such a short period of time in the FPM DRAM memory requires that the processor be scheduled to read the data during this short time interval. Hence, in situations where the processor is receiving data from more than one memory device, scheduling for the processor to access the data from any one FPM memory is complicated by the limited period of time that the data is valid on the data output pins. Further, the processor quite often has to idly wait for the data to become valid before proceeding to initiate another data access cycle. For these reasons, the FPM DRAM memories often result in the processor's having to sit idle awaiting the data thereby causing the processor to be inefficient. Hence, there was a need for some way of allowing for greater flexibility in scheduling the processor to access data from one or more memory devices to thereby speed up the processor in accessing data from multiple memory devices.

To address this particular need, extended data out (EDO) DRAM memories were developed. An EDO memory is simply an enhancement of the previously existing FPM memory except that the EDO memory latches the data on the output pins during the period of time after the CAS signal goes high until the CAS signal goes low again. This period of time is typically referred to as the CAS precharge time. FIG. 1B illustrates a typical EDO mode access cycle. In the EDO device, a low CAS signal causes the data to be retrieved from the memory. Once the data becomes valid, it stays valid until the CAS signal begins to go low for a subsequent read cycle. Hence, in the EDO device, the data is valid on the output pins for a time period which includes the CAS precharge time. Hence, the memory controller or some other processor can access the data on the output pins of the EDO memory for a longer period of time. This results in easier scheduling of the memory controller and, where the memory controller is being used with more than one memory module, the memory controller is, in fact, faster due to this easier scheduling.

However, one difficulty associated with the EDO devices is that these devices are expensive and are not readily available to users of the chips. In particular, the standard EDO DRAM memory has additional circuitry, including latches and the like, built onto the chip to ensure that the data is maintained during the CAS precharge time. It will be appreciated that this additional circuitry increases the cost of the DRAM memory. Further, since computer manufacturers have begun to use EDO DRAM memory in their computer circuits, the demand for EDO memories has outstripped the supply.

Hence, there is a need in the prior art for an inexpensive memory circuit which can be used with non-EDO memory that will latch data for an extended period of time. In particular, there is a need for an inexpensive circuit which can be used in conjunction with more commonly available DRAM memories, such as FPM mode DRAM memories, that will latch data on the output for an extended period of time.

SUMMARY OF THE INVENTION

To address these needs, a latching circuit with associated control logic has been developed which is configured to be used in conjunction with an existing memory to latch the data for an extended period on the output. In the preferred embodiment, the latching circuit includes, for each bit of the data bus width, a memory transceiver which can be connected via a data bus to the memory and a system transceiver which can be connected via a data bus to the computer system. The circuit also includes an internal data-in bus which directly couples the system transceiver to the memory transceiver so that data being written to the memory passes directly through with a minimum of delay. Further, the circuit also includes an internal data-out bus which couples the memory transceiver to the system transceiver. The data-out bus also includes a latch so that, when data is being read from the memory, the data bit can be latched on the output for an extended period of time to allow for more flexible scheduling of the memory controller.

The latching circuit also preferably has control logic which controls the transceivers and the latch so that the transceivers correctly pass the data onto either the data-in bus or the data-out bus and also latches the data for the extended period of time. In the preferred embodiment, the control logic provides control signals to a multiple of latching circuits. For example, a single control logic cell can be used to control latching circuits for all eight bits of an eight bit word.

Further, the control logic and the latching circuits are preferably configured so that the latching circuit is normally configured so as to be able to write data into the memory. Hence, when the memory controller or processor is reading data from the memory, the control logic must configure the transceivers and the latch so that the data can be passed onto the data-out bus and then be latched in the latch for the appropriate period of time.

In the preferred embodiment, the latching circuit and associated control logic are configured to be used with Fast Page Mode DRAM memory devices. The control logic receives the RAS, CAS, OE, and WE signals from the memory controller or memory motherboard which is requesting the data. In the event that data is being written to the DRAM memory, the latching circuit is configured so that the data passes through the circuit to the memory. In the event that data is being read from memory, the control logic receives the OE signal and then configures the transceivers to pass the data on the data-out bus. Further, the control logic is also preferably configured to enable the latch to latch the data on the data-out bus until the control logic receives a new RAS, CAS or WE signal.

Hence, the latching circuit and control logic of the preferred embodiment allows for data to be read out of a readily available memory device and then latched on the output for an extended period. This results in a readily available memory device that can be used to allow for more flexible scheduling of the memory controller in accessing the data.

These and other objects and features of the present invention will become more fully apparent from the following description and appended claims taken in conjunction with the accompanying drawings.

DETAILED DESCRIPTION OF THE PREFERRED EMBODIMENTS

Figure 2A:
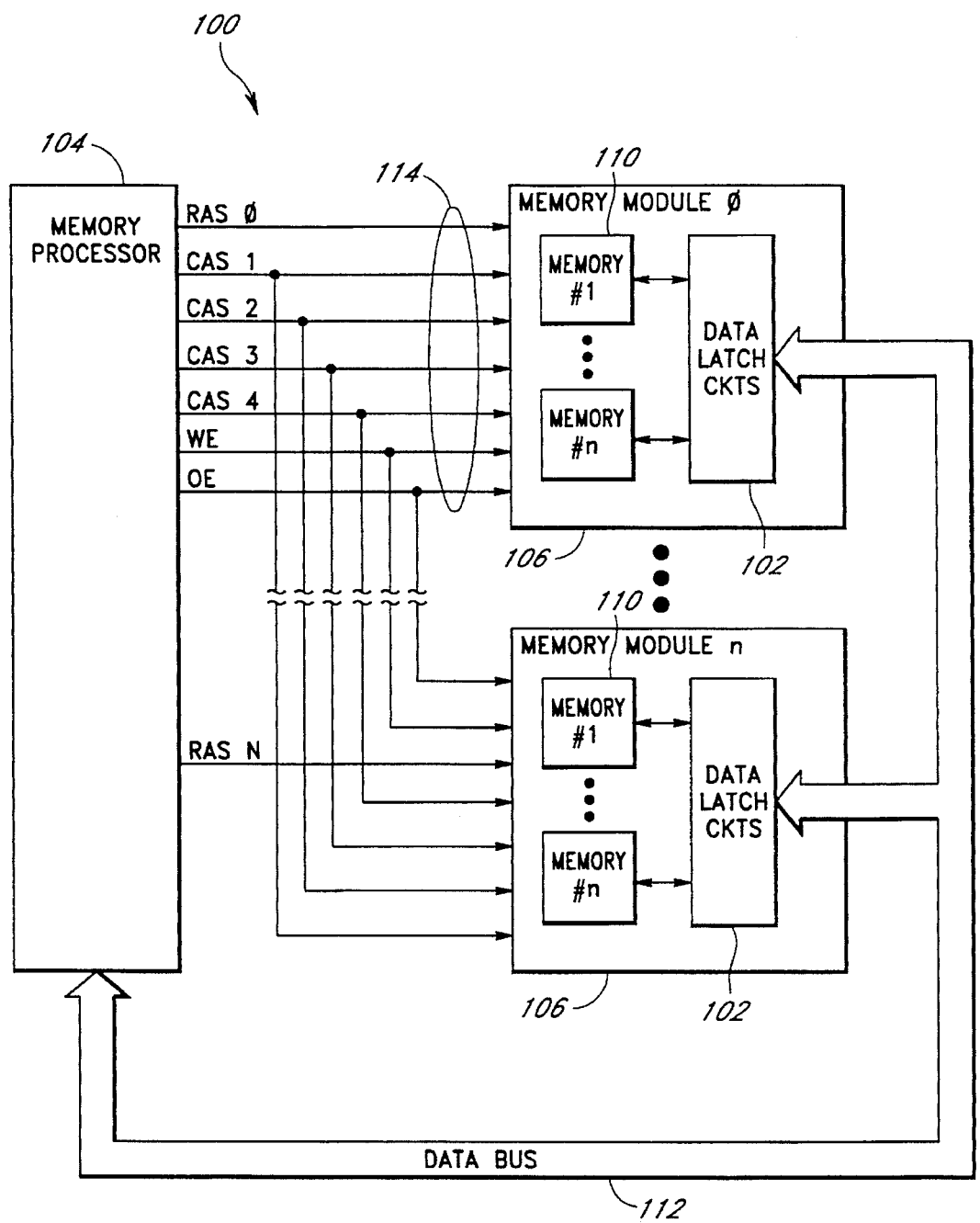
FIG. 2A is one embodiment of a system incorporating a data latch circuit and associated control logic of the present invention.

Reference will now be made to the drawings wherein like numerals refer to like parts throughout. FIG. 2A illustrates a computer system 100 that incorporates one or more data latch circuits and associated control logic 102 of the preferred embodiment. Specifically, the computer circuit 100 includes a memory processor 104 which, in one typical implementation, is a memory controller on a memory board of a computer. The memory processor 104 is preferably connected to a plurality of memory modules 106. The memory modules 106 in the embodiment shown in FIG. 2A, include a plurality of memory devices 110 and the data latch circuit 102. The memory processor 104 sends and receives data signals to and from the memory devices 110 in the memory modules 106 via a data bus 112. Preferably, the data bus 112 is interconnected to the memory devices 110 in the memory modules 106 through the data latch circuit 102 in the manner that will be described hereinbelow in reference to FIGS. 3 and 4.

In the preferred embodiment, the memory modules 106 are comprised of 1×32 bit Single In-line Memory Modules (SIMMs) that have two 1×16 bit FPM type DRAM memory devices 110. The data latch circuit 102 is preferably mounted on the SIMM and is preferably comprised of a Toshiba type TC160G16ES Application Specific Integrated Circuit (ASIC) with fast I/O pads that have a delay of less than approximately 2.4 nanoseconds. In the preferred embodiment the ASIC comprising the data latch circuit 102 is programmed so that the functional operation of the data latch circuit 102, which is described in greater reference to FIG. 5 hereinbelow, is implemented using selected hardware components of the ASIC chip.

Preferably, the memory processor 104 sends a plurality of control signals via a plurality of control lines 114 to the memory modules 106. In addition, the memory processor 104 sends a plurality of address lines (not shown) to the memory module 104 which specifies the address in the memory devices 110 of the data that is being accessed by the memory processor 104. The control lines 114 provide an indication of the operation that is being performed by the memory device 110. It will be understood that, in the preferred embodiment, the FPM DRAM memories comprising the memory devices 110 operate in the manner that is well known in the art.

In the preferred embodiment, there is a separate row address select (RAS) control line going from the memory processor 104 to each of the memory modules 106. There are also four column address select lines (CAS) that go to each of the memory modules 106. Further, there is a write enable (WE) and an output enable (OE) control line that also extends from the memory processor 104 to the memory modules 106.

In the preferred embodiment, the RAS signal clocks in a page or row address, sent by the memory processor 104 to the memory module 106, that identifies the page location of the FPM DRAM memory 110 where the data is either to be read or where the data is to be written. Further, the CAS signal clocks in a column address sent by the memory processor 104 to the memory module that identifies the bit locations within the page of memory that are to be either read or written. Finally, the write enable (WE) and the output enable (OE) signals indicate to the memory module 104 whether the memory processor 104 is writing data to the memory devices 110 or is reading data from the memory devices 110 indicated by the RAS and CAS signals. All data signals, whether they are writes or reads, are preferably transmitted between the memory processor 104 and the memory 110 via the data bus 112.

In the preferred embodiment, when the memory processor 104 requests data from the FPM DRAM memories 110, the appropriate RAS and CAS signals are sent to the appropriate memory module 106 along with the output enable (OE) signal and the write enable (WE) signal.. The RAS and CAS signals and the WE and OE signals are provided to the memories 110 and also to the control logic associated with the data latch circuit 102. The data is retrieved out of the memories 110 in the normal fashion that it is retrieved out of prior art FPM DRAM-type memories. The data is then sent to the data latch circuit 102 wherein the data is latched in the data latch circuit 102 in a location accessible to the memory processor 104 for an extended time period. This allows the memory processor 104 a longer time period to access and retrieve the data that was read out of the FPM DRAM memory devices 110. Hence, the memory processor 104 can be more efficient in that it can request data out of one memory module and then proceed to request data out of another memory module and then come back and get the data out of the first memory module which will still be available as it is latched in the data latch circuit 102.

Figure 1A:
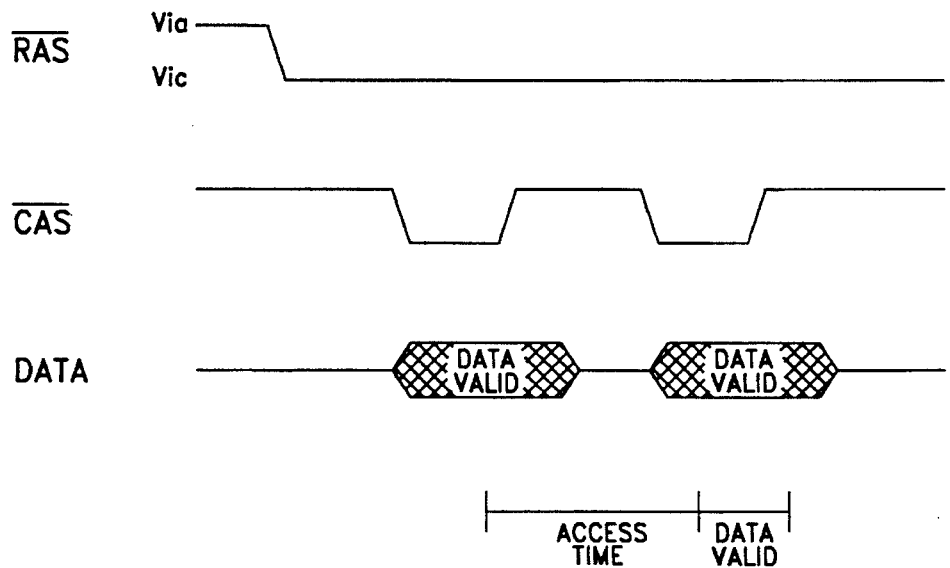
FIG. 1A is a timing chart illustrating the access cycle of a prior art FPM DRAM memory device.
Figure 1B:
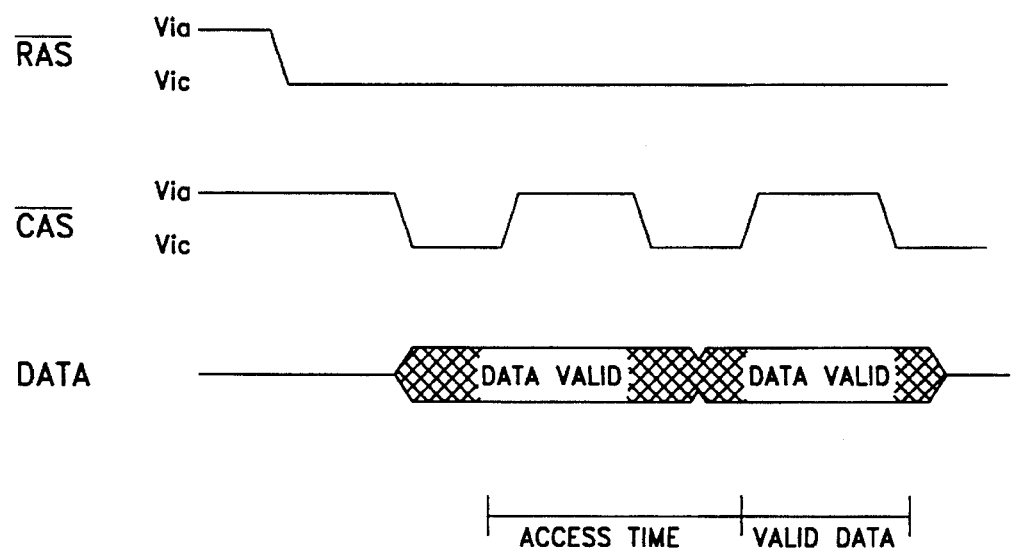
FIG. 1B is a timing diagram illustrating the access cycle of a prior art EDO DRAM memory device.

In the preferred embodiment, the FPM DRAM memory device 10 outputs data on the data bus 112 each time the CAS signal goes low. However, in the prior art, the FPM DRAM memory 110 invalidates this data when the CAS signal goes high again (see, FIG. 1A). However, the data latch circuit 102 of the preferred embodiment is configured to receive the valid data from the FPM DRAM memory devices 110 and it preferably latches the valid data signals until the CAS signal goes low again. Hence, the data latch circuit, in the preferred embodiment, results in the memory processor 104 effectively seeing an extended data out (EDO) memory access cycle like the cycle shown in FIG. 1B. Hence, the preferred embodiment implements an extended data-out memory solution using readily available FPM DRAM memory devices and a separate ASIC chip to latch the data out of the FPM memory device for an extended period of time. Consequently, the advantages of extended data-out can be provided less expensively than the EDO DRAM memory devices of the prior art.

Figure 2B:
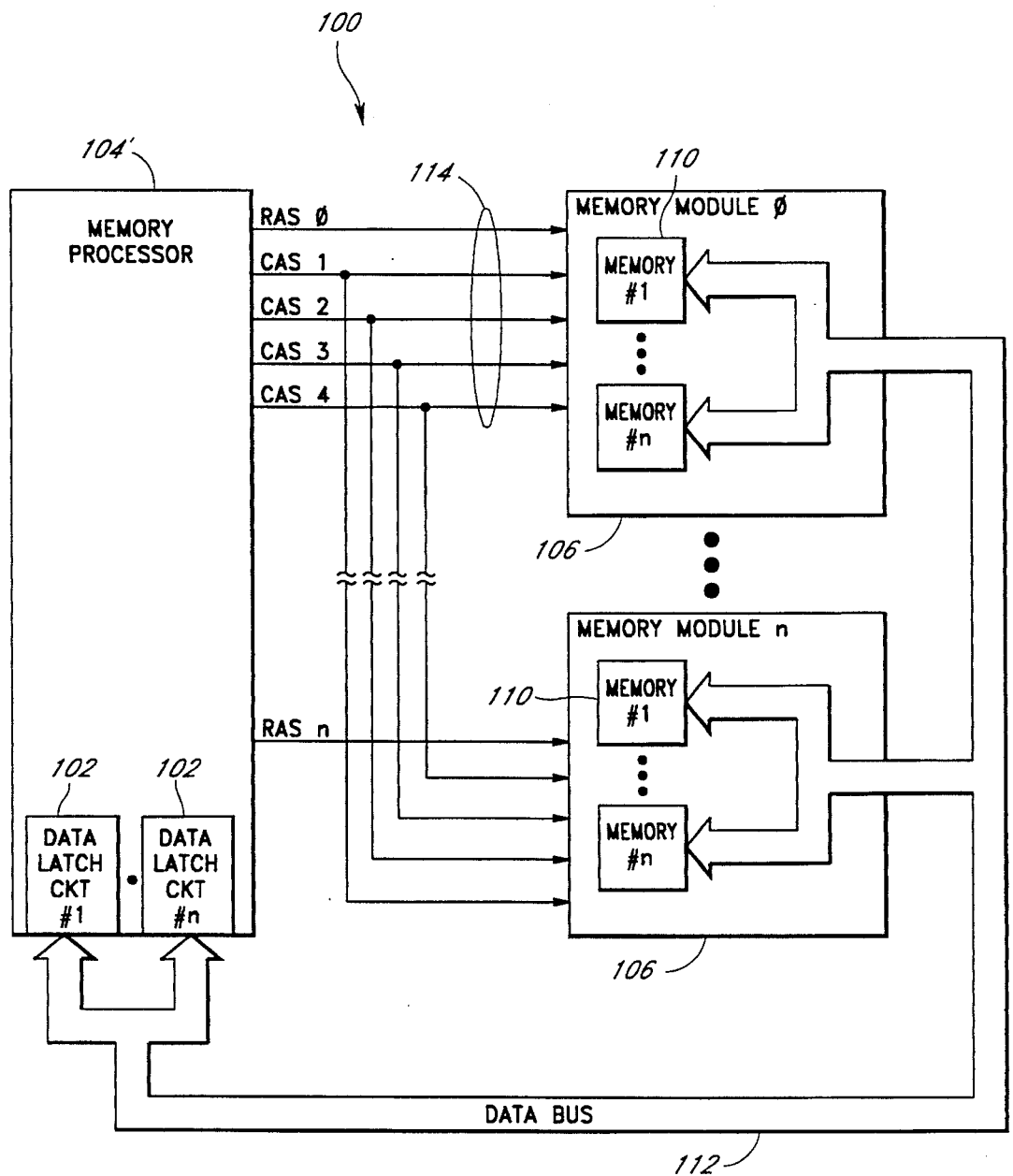
FIG. 2B is another embodiment of a system having the data latch circuit and associated control logic of the present invention.

FIG. 2B illustrates another embodiment of a computer system 100' that uses the data latch circuit and associated control 102 of the present invention. Specifically, the primary difference between the circuits shown in FIG. 2A and the circuit shown in FIG. 2B is that the data latch circuit 102 in FIG. 2A is positioned on the memory module which, in the preferred embodiment, is a well-known SIMM. However, in FIG. 2B the data latch circuit 102 for each of the memory modules is positioned on the memory processor itself. It will be understood from the following discussion that the positioning of the data latch circuit 102 does not affect the advantageous operation of the computer system 100. Specifically, it will be understood that the data latch circuit 102 can be positioned on the memory controller just as easily as it could be positioned on the memory modules.

Figure 3:
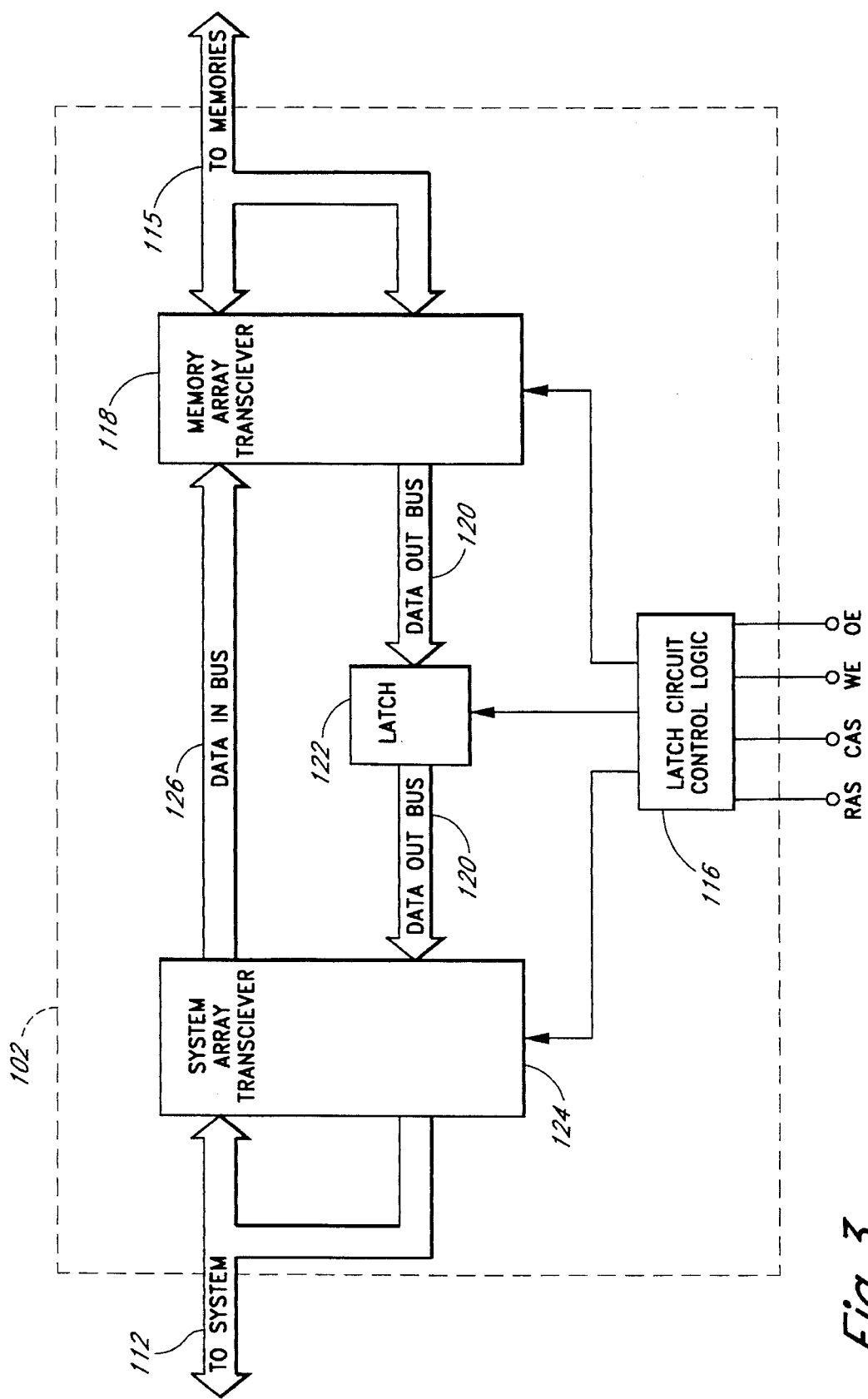
FIG. 3 is a functional block diagram of the data latch circuit and associated control logic shown in FIGS. 2A and 2B.

FIG. 3 is a functional block diagram which illustrates the logical arrangement of the data latch circuit and associated control logic 102. As previously described, the data latch circuit 102 is implemented on an ASIC chip and, in the embodiment shown in FIG. 2A, is positioned on the memory module 106 external to, but adjacent, the memory devices 110. In the preferred embodiment, the data latch circuit and associated control logic 102 is essentially comprised of a plurality of latch circuits 117 (one shown) and a block of control logic 116 that controls the plurality of latch circuits 117. Specifically, there is one latch circuit 117 for each bit of information that is retrieved and/or sent to the memory 110. However, there is a control logic block 116 that is associated with a plurality of latch circuits 117 to control the operation of the latch circuits 117. For example, in one preferred implementation, there is a single control block 116 for each 8-bit data word that is retrieved from the memory 110. Since there is a latch circuit 117 for each bit, the control block 116 controls eight separate latch circuits 117 which are substantially identical to the one latch circuit shown in FIG. 3. The following description of the latch circuit 117 will explain the operation of a single latch circuit 117 latching a single bit of information. However, it will be understood that the operation of each of the latch circuits 117 in the data latch circuit 102 simultaneously operate in the same manner.

The latch circuit 117 is preferably connected via a memory data bus 115 to one of the memory devices 110. The memory data bus 115 is connected to a memory array transceiver 118 which, in a read mode, receives the data signal from the memory device 110 and then transmits the data signal on a data-out bus 120. The data-out bus 120 provides the signal to a latch 122. The data signal is preferably latched in the latch 122 and is then provided to the memory processor 104 (FIGS. 2A, B) via the data-out bus 120 and via a system array transceiver 124. The system array transceiver 124, when receiving data signals from the data-out bus, is configured to then send the signals to the data bus 112 shown in FIGS. 2A and 2B. Alternatively, in a write mode, a data bit that is transmitted on the data bus 112 enters the system transceiver 124 which is then configured to position the data bit on the data-in bus 126. The data bit is then transmitted through the memory array transceiver 118 to the memory data bus 115. In the preferred embodiment, the data bit signal is then recorded in the memories 110 in the normal manner for FPM mode DRAM memories.

Logic control block 116 receives the RAS, CAS, WE and OE signals from the memory processor 104. As described previously, these signals indicate whether memory is being written to or read from and they also clock in the row and column address signals sent to the memory devices 110. Hence, these signals are provided to not only the memories 110, but also to the control logic 116. The control logic 116 deciphers these signals to set the latch circuit 117 in the appropriate configuration.

In the preferred embodiment the memory latch circuit 102 is configured to be normally in a mode where the memory transceiver 118 and the system transceiver 124 receive data on the data-in bus 126. In other words, the data latch circuit 102 is configured so that in the event that the memory processor 104 sends a write signal, i.e., a WE signal, to the memory module 106 (FIG. 2A) the data latch circuit 102 is already configured to directly pass the data signals to the memory devices 110 with a minimum of delay. However, in the event that the system processor 104 is reading data from the memories 110, the control logic 116 receives the output enable (OE) signal from the system processor 104 and thereby sets the system array transceiver 124 and the memory array transceiver 118 to transmit data from the processor 104 to the memories 110 via the data-out bus 120.

Figure 4:
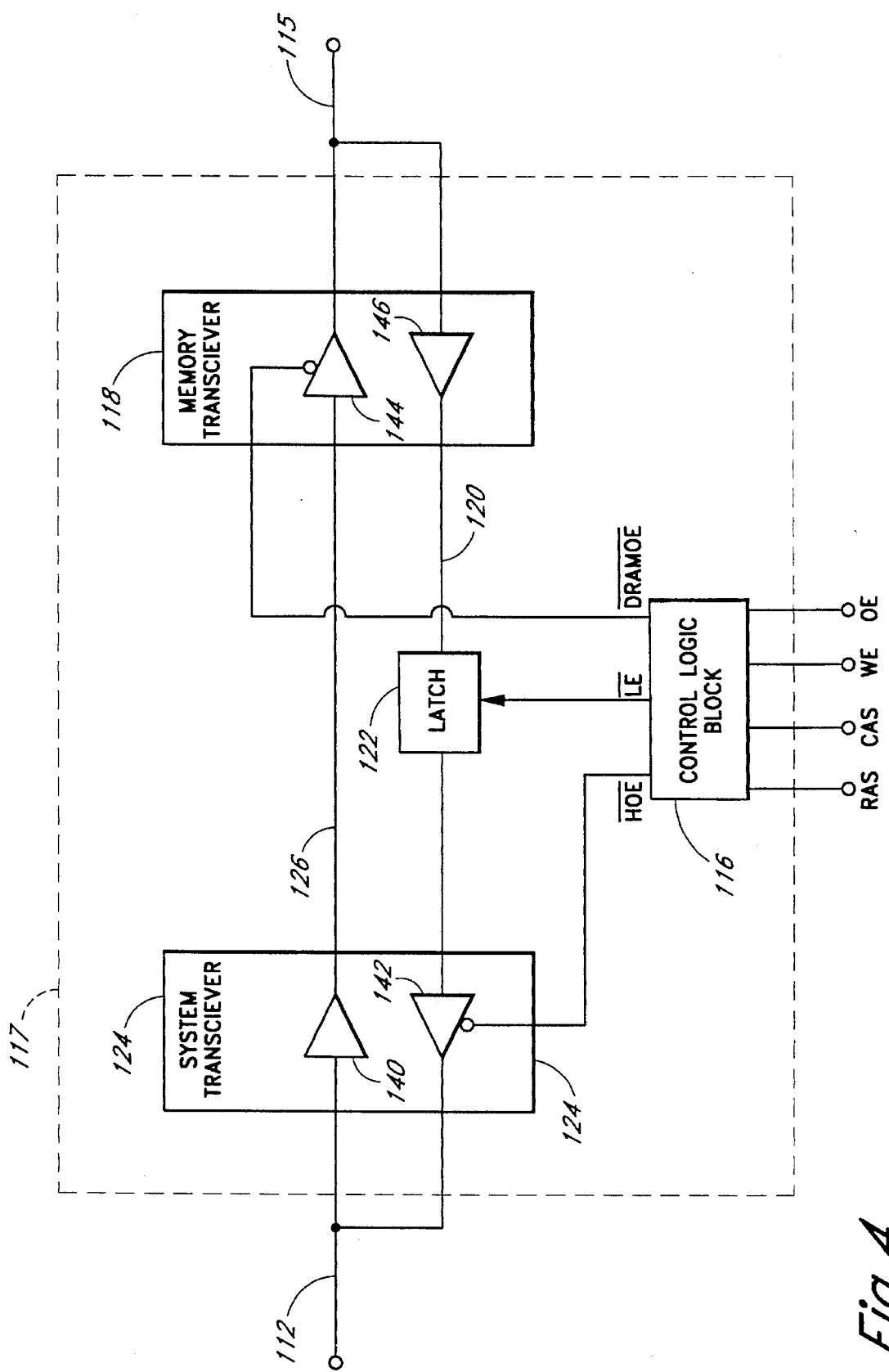
FIG. 4 is a functional schematic further illustrating the data latch circuit of FIG. 3.

FIG. 4 is another functional block diagram which further illustrates the operation and structure of the latch circuit 117 and the control block 116. As shown in FIG. 4, the system transceiver 124 is comprised of a buffer 140 which feeds a data bit received from the bus 112 onto the data-in bus 126. Further, the system transceiver 124 includes a tri-state buffer 142 which allows a data bit on the data-out bus 120 to pass onto the data bus 112 when the tri-state buffer 142 is enabled by a Host Enable Signal (HOE) from the control logic 116.

Similarly, the memory transceiver 118 includes a buffer 146 which feeds a data bit received from the memory bus 115 to the data-out bus 120 and the latch 122. Further, the memory transceiver 118 also includes a tri-state buffer 144 which, when enabled, allows a data bit to pass from the data-in bus 126 to the memory bus 115 thereby effectively enabling the data-out bus 120. The tri-state buffer 144 is preferably normally enabled, so that, during a write cycle, a data bit passes directly through the latch circuit 117 with minimal delay as the tri-state buffer 144 is normally in a position to pass the data bit therethrough.

However, during a read cycle, the control logic 116 receives the OE signal from the memory processor 104 causing the control logic to disable the tri-state buffer 144 by sending a DRAMOE signal. This effectively disables the data-in bus 126 by isolating the data-in bus 126 from the memory bus 115. It will be understood that, unless the data-in bus 126 is isolated from the memory bus 115, the data bus 112 going to the memory processor 104 may receive data bit signals from more than one source.

The data latch circuit and associated control logic 102 is preferably implemented on an ASIC chip to minimize any additional delays in writing information to memory or reading information from memory. In the preferred implementation, the latch circuits 117 are configured so that they are normally in a mode where data signals are written to the memory devices 110. This minimizes any additional delay resulting from using the latch circuit 117 as there is no need to reconfigure the latch circuit 117, from either a tri-state or from a read configuration, to perform a write cycle. The latch circuit 117 is preferably configured on the ASIC chip so that the delay in transmitting the data bit signal across the data-in bus 126 does not impede the memory device 110 in clocking in the data into the memory array. Hence, the latch circuit 117 provides the data bit to the memory device 110 prior to the memory device 110 initiating the actual recording of the data bit in the memory array.

During a read cycle the memory transceiver 118 and the system transceiver 124 must be changed from a configuration wherein the latch circuit 117 is writing data to the memory, into a configuration wherein the latch circuit 117 is providing data to the memory controller 104. In the preferred embodiment, this requires that the tri-state buffer 142 in the system transceiver 124 be enabled to enable the data-out bus 120 and to provide output to the data bus 112 and that the tri-state buffer 144 in the memory transceiver 118 be tri-stated to disable the data-in bus 126. It is understood that there is some delay before the memory devices 110 are able to output the data bit signals. With the FPM DRAM memory devices 110 used in the preferred embodiment, there is a 10–15 nanosecond delay before data is output from the memory device in response to the read request. The control logic 116 sends the HOE signal and the DRAMOE signal during this time period to configure the latch circuit 117 prior to the data signals arriving at the memory transceiver 118.

Figure 5:
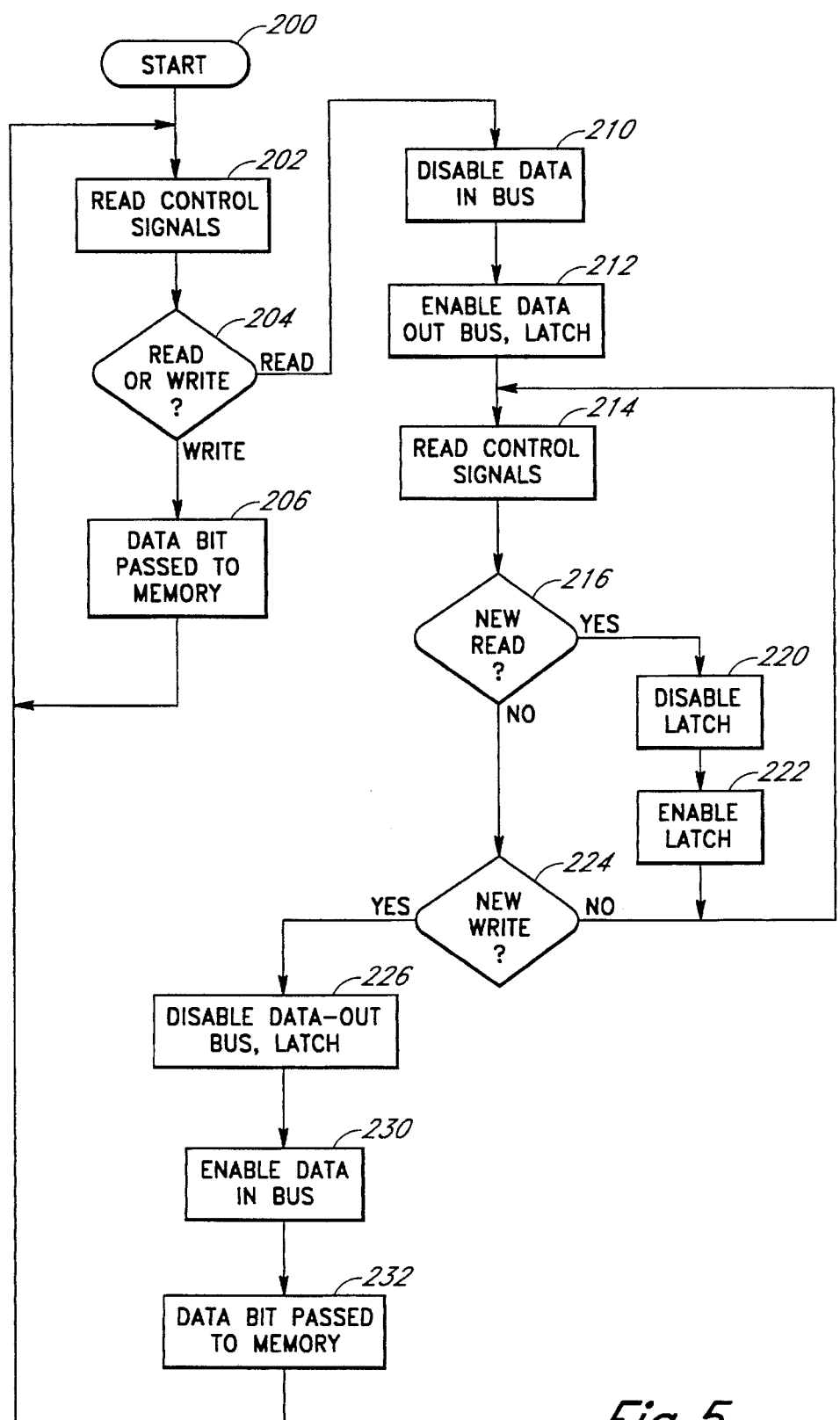
FIG. 5 is a flow-chart illustrating the operation of the data latch circuit of FIG. 3.

FIG. 5 is a flow chart which illustrates the operation of the memory latch circuit and associated control logic 102 of the preferred embodiment. It will be understood that the functional blocks shown in FIG. 5 are illustrative of the hardware implementation on the ASIC chip. In other words, each of the function blocks shown in FIG. 5 are representative of interconnected gates, latches, etc. that have been selected on the ASIC chip to perform these functions. It will be further understood that the implementation of the function blocks shown in FIG. 5 should be done on a very fast ASIC that has fast I/O pads, e.g., I/O pads having a delay on the order of 2.0 nanoseconds although faster I/O pads may also be used wherein the components are selected and organized to minimize the additional delay provided by the data latch circuit 102 in providing the data to the data bus 112.

Referring now to FIG. 5, the control logic 116, from a start state 200, reads in state 202, the control signals 114 provided from the memory processor 104. As shown in FIGS. 3 and 4, the controls signals include the RAS, CAS, WE and OE signals provided by the memory processor 104 to the memory modules 106 (FIGS. 2A, 2B). These control signals are also provided to the memory devices 110.

The control logic 116 then determines, in decision state 204, whether the memory processor 104 has initiated a read or write cycle. If the memory processor 104 has initiated a write cycle, by sending an appropriate WE signal, the latch circuit 117, in state 206, passes the data received from the data bus 112 directly through the buffer 140, the data-in bus 126 and the tri-state buffer 144. As described earlier, the tri-state buffer 144 is preferably configured so as to be normally enabled to thereby pass the data through the data latch circuit 117 with a minimum of delay. Once the data has been written to memory, the control logic 116 then continues to read the control signals WE, OE, RAS, CAS to determine the next operation.

If, in decision state 204, the control logic 116 determines that the memory processor 104 is reading information from the memory devices 110, the control logic 116 then proceeds, in state 210, to disable the data-in bus 126 and, in state 212, to enable the data-out bus 120 and the latch 122. In other words, if the memory processor 104 sends an appropriate OE, RAS, and CAS signal to the memory module 106 (FIG. 2A) the control logic 116 sends the DRAMOE signal to the buffer 144 to disable the data-in bus 126, the LE signal to the latch 122 to enable the latch and the HOE signal to the tri-state buffer 142 to enable the data-out bus 120.

Subsequently, when the data bit identified by the control signals sent to the memory devices from the memory processor 104 enters the data latch circuit 117, the memory bit is routed onto the data-out bus 120 and is latched into the latch 122. The latched data is then held available for the memory processor 104 to access via the data bus 112 for an extended period of time.

In the preferred embodiment, the data is latched in the latch 122 until the control logic 116 receives a control signal indicating that a new read cycle or a new write cycle has been initiated by the memory processor 104. If, in decision state 216, the control logic 116 determines that a new read cycle has been initiated, the control logic 116 then disables the latch 122 by sending an appropriate latch enable signal (LE) to the latch 122 to make the latch 122 transparent. Subsequently, after an appropriate delay time, the latch 122 is then enabled by the control logic in state 222 to latch the next data bit output by the memory device 110.

In the preferred embodiment, a new read cycle occurs when the CAS signal goes low again with the RAS signal remaining the same. This results in new data locations on the same page of the FPM DRAM memory device 110 being accessed. Hence, in this mode of operation, the data output in one cycle will be latched by the latch 122 during the period of time after the CAS signal goes high prior to the CAS signal going low again for the next read cycle. This period of time is typically referred to as the CAS precharge time $T_{cac}$. This extends the period that the data is available to the memory processor 104 via the data bus 112. A new read cycle is also initiated when the RAS signal changes. This occurs when the memory processor 104 is seeking data stored in a different row or page of the memory devices 110. In the event that this happens, the control logic 116 also disables the latch 122 in state 220 and then enables it again in state 222 in the previously described manner.

The control logic 116 and the latch circuit 117 continues to latch data signals into the latch 122 until the memory processor initiates a new write cycle. Hence, in the preferred embodiment, if the control logic 116 determines in decisions state 224 that the OE or WE signals has changed state, the control logic 116 then proceeds to disable the data-out bus 120 and the latch 122 in state 226 and enable the data-in bus 126 in state 230. Specifically, in the preferred embodiment, the control logic 116 will send an appropriate HOE signal to the buffer 142 to disable the data-out bus 120, an appropriate LE signal to the latch 122 to disable the latch and an appropriate DRAMOE signal to the buffer 144 to enable the data-in bus 126. The data on the bus 112 then, in state 232, passes though the latch circuit 117 via the data-in bus 126 in state 232.

The foregoing description has described how the data latch circuit 117 and the control logic 116 allows for a data bit being written to the memory devices 110 to pass through the circuit 102 and how the data latch circuit 117 and control logic 116 latch a data bit being read from the memory devices 110 to be latched on the output of the circuit 102 for the processor to access. It will be understood that it is desirable to minimize any additional delays resulting from the addition of the circuit 102 to the memory devices 110. In particular, in a memory circuit using an FPM type DRAM memory, the delay resulting from the addition of the circuit 102 should be less than 9 nanoseconds when data is being read from the memory. In the preferred embodiment, the ASIC is configured so that the delay is on the order of only 5 nanoseconds.

Further, from the foregoing, it can be seen that the data latch circuit of the preferred embodiment during a read cycle is capable of maintaining the data being read for an extended period of time. This allows the memory processor or memory controller an extended period of time to access the data thereby providing greater flexibility and speed to the processor's operation. It will be appreciated that in one embodiment the present invention provides an EDO solution using readily available ASIC devices and FPM DRAM memory devices. Hence, the advantages of EDO functionality can be provided without any of the cost and availability issues associated with prior art.

Although the foregoing description of the preferred embodiment of the present invention has shown, described and pointed out the fundamental novel features of the invention, it will be understood that various omissions, substitutions, and changes in the form of the detail of the apparatus as illustrated, as well as the uses thereof, may be made by those skilled in the art, without departing from the spirit of the present invention. Consequently, the scope of the invention should not be limited to the foregoing discussion, but should be defined by the appended claims.

What is claimed is:

1. A circuit to be used in conjunction with a memory processor and a memory device for latching data being read from the memory for an extended period of time to allow the memory processor to access the data during the extended period of time, said circuit comprising:

a first transceiver connected to a memory device;

a second transceiver connected to a memory processor;

a data-in bus interconnecting the first transceiver and the second transceiver wherein the data-in bus has a default state wherein the data-in bus is connected to said memory device through said first transceiver;

a data-out bus interconnecting the second transceiver and the first transceiver wherein the data-out bus has a default state wherein the data-out bus is isolated from said memory processor through said second transceiver;

a latch connected to said data-out bus so as to latch data on said data-out bus; and control logic providing control signals to said first and second transceivers and to said latch, wherein said control logic, in response to receiving signals from said memory processor indicating said memory processor is reading data from said memory device, isolates said data-in bus from said memory device, connects said data-out bus to said memory processor and enables said latch to thereby latch a data bit on said data-out bus for an extended period of time, said data-in bus and said data-out bus returning to said default states upon completion of said memory processor reading said latched data bit.

2. The circuit of claim 1, wherein said first transceiver includes a first tri-state buffer coupled to said data-in bus wherein said first tri-state buffer is normally enabled in a default state so as to connect said data-in bus to said memory device and is only disabled in response to said control logic sending a disabling signal to said tri-state buffer.

3. The circuit of claim 2, wherein said second transceiver includes a second tri-state buffer which is enabled in response to said control logic sending an enabling signal to said second tri-state buffer causing said second tri-state buffer to connect said data-out bus to said memory processor.

4. The circuit of claim 3, wherein said data-in bus is connected via said second transceiver to said memory processor and wherein said data-out bus is connected via said first transceiver to said memory device.

5. The circuit of claim 1, wherein said memory device is a FPM DRAM memory device and wherein said control logic received CAS, RAS, OE and WE signals from said memory processor.

6. The circuit of claim 5, wherein said control logic induces said latch to latch a data bit read from said memory device during a CAS pre-charge time.

7. The circuit of claim 5, wherein said control logic enables said latch, to thereby latch a data bit read from memory upon said CAS signal from said memory controller going low and said control logic disables said latch upon said CAS signal from said memory controller subsequently going low again.

8. The circuit of claim 1, wherein said circuit is implemented on an ASIC chip that is positioned external to said memory device.

9. The circuit of claim 8, wherein said circuit is organized in said ASIC chip so that any additional delay in providing data read out of said memory device to said memory processor as a result of said circuit is less than 9 nanoseconds.

10. The circuit of claim 9, wherein said memory device and said ASIC chip are positioned on a memory module.

11. The circuit of claim 9, wherein said memory device is positioned on said memory module and said ASIC chip is positioned on a memory motherboard.

12. A circuit to be used in conjunction with a memory processor and a memory device for latching a data bit read from the memory device for an extended period for the memory processor to access, comprising:

a first switch which is connected to said memory device;

a data-in bus which is connected to said first switch and is also connected to said memory processor;

a second switch which is connected to said memory processor;

a data-out bus which is connected to said second switch and is also connected to said memory device;

a latch connected to said data-out bus; and control logic operably engaged with said first switch, said second switch and said latch, wherein said control logic receives signals from said memory processor indicative of whether said memory processor is reading data from said memory device or is writing data to said memory device and wherein, when said control processor is reading data from memory, said latch receives a data bit and said control logic enables said latch to latch said data bit, enables said first switch to isolate said data-in bus from said memory device and also induces said second switch to connect said data-out bus to said memory processor.

13. The circuit of claim 12, wherein said first switch is normally in a position wherein said data-in bus is connected to said memory device.

14. The circuit of claim 13, wherein said circuit is implemented on an ASIC chip and said memory device is comprised of at least one FPM mode DRAM memory.

15. A circuit for latching data from a memory device during a read cycle and for providing data to said memory device during a write cycle, wherein said circuit comprises:

one or more latch circuits normally in a default configuration wherein a data bit signal from a memory processor is transmitted through said latch circuit to said memory device during a write cycle, and wherein said one or more latch circuits can be switched into a second configuration wherein a data bit signal from said memory device is latched in a location where it is accessible to said memory processor for an extended period of time; and control logic which controls said one or more latch circuits so as to switch said one or more latch circuits from said first configuration to said second configuration during a read cycle.

16. The circuit of claim 15, wherein said memory storage device includes a data storage array and wherein said one or more latch circuits are configured to provide the data bits from said memory processor to said memory device during a write cycle prior to said memory device clocking in said data into said data storage array.

17. The circuit of claim 16, wherein each of said one or more latch circuits comprise:

a memory transceiver connected via a memory data bus to said memory device;

a system transceiver connected via a system data bus to said memory processor;

a data-in bus interconnecting the memory transceiver and the system transceiver;

a data-out bus interconnecting the system transceiver and the memory transceiver; and a latch connected to said data-out bus so as to latch data on said data-out bus.

18. The circuit of claim 17, wherein said control logic provides control signals to said memory transceiver, said system transceiver and said latch and wherein said control logic, in response to receiving signals from said memory processor indicating that said memory processor is reading data from said memory, disables said data-in bus and enables said data-out bus and said latch to thereby latch a data bit on said data-out bus for an extended period of time.

19. The circuit of claim 18, wherein said memory transceiver includes a first switch which is connected between said data-in bus and said memory bus wherein said first switch is normally in a first position wherein said data-in bus is connected to said memory bus.

20. The circuit of claim 19, wherein said system transceiver includes a second switch which is connected between said data-out bus and said system bus.

21. The circuit of claim 20, wherein said control logic provides control signals to said first and said second switches to switch said circuit between said first and said second configurations.

22. The circuit of claim 15, wherein said memory device is an FPM DRAM memory device and said control logic receives a write enable (WE), an output enable (OE), a column address signal (CAS) and a row address signal (RAS) from said memory processor.

23. The circuit of claim 22, wherein said FPM DRAM memory device, during a read cycle, outputs data bits to said one or more latch circuits on said CAS signal going low and wherein said control logic induces said one or more latch circuit to latch data output from said FPM DRAM memory during a first read cycle until said CAS signal goes low again indicating the initiation of a second read cycle.

24. The circuit of claim 23, wherein said circuit is implemented on an ASIC chip external to said memory device wherein said ASIC chip has I/O pads with a delay of approximately 2.0 nanoseconds or less.

25. The circuit of claim 24, wherein said circuit is organized in said ASIC chip so that any additional delay in providing data to said memory processor read out of said memory device as a result of said circuit is less than 9 nanoseconds.

26. A method of latching data output from a memory device to a memory processor for an extended period of time comprising the steps of:

configuring a latch circuit into a first configuration wherein data bits transmitted from said memory processor to said memory device pass along a data-in bus directly through said latch circuit from said memory processor to said memory device;

re-configuring said latch circuit into a second configuration, in response to said memory processor initiating one or more sequential read cycles, so that said data-in bus is isolated from said memory device and so that data bits output from said memory device are latched on a data-out bus of said latch circuit in a position wherein said memory processor can access said data bits for an extended period of time; and switching said latch circuit back to said first configuration upon completion of said one or more sequential read cycles.

27. The method of claim 26, wherein the step of configuring a latch circuit into a first configuration comprises providing a latch circuit which includes a first and a second transceiver, said data-in bus and said data-out bus, wherein said data-in bus is connected to said memory processor and is connected to said memory device via a first switch and wherein said data-out bus is connected to said memory device and is connected to said memory processor via a second switch and wherein said first switch is normally in a configuration wherein said data-in bus is connected to said memory device and wherein said second switch is normally in a configuration wherein said data-out bus is isolated from said memory processor.

28. The method of claim 27, wherein the step of reconfiguring said latch circuit into a second configuration comprises switching said first switch into a configuration wherein said data-in bus is isolated from said memory device and switching said second switch into a configuration wherein said data-out bus is connected to said system processor.

29. The method of claim 28, wherein said step of reconfiguring said latch circuit comprises enabling a latch to latch data on said data-out bus for an extended period of time.

30. The method of claim 29, wherein the step of enabling a latch comprises enabling said latch to latch the data during a time period defined by the time the data is output from said memory device until the time a subsequent read cycle has been initiated by said processor.

31. The method of claim 30, wherein said memory device is a FPM DRAM memory device and said step of enabling comprises enabling said latch to latch the data during a time period defined by a CAS signal going low a first time until said CAS signal goes low a subsequent time.

32. The method of claim 31, wherein the step of switching said latch circuit back to said first configuration comprises configuring said first switch to connect said data-in bus to said memory device and configuring said second switch to isolate said data-out bus from said memory processor.

33. The method of claim 32, wherein said switching step occurs in response to said memory processor initiating a write cycle or altering an output enable (OE) signal.

* * * * *